(12) United States Patent
Kim

(10) Patent No.: US 12,367,802 B2
(45) Date of Patent: Jul. 22, 2025

(54) DISPLAY DEVICE AND MANUFACTURING METHOD OF THE SAME

(71) Applicant: Samsung Display Co., LTD., Yongin-si (KR)

(72) Inventor: Kyungsik Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/889,257

(22) Filed: Aug. 16, 2022

(65) Prior Publication Data

US 2023/0067080 A1   Mar. 2, 2023

(30) Foreign Application Priority Data

Aug. 26, 2021   (KR) .................. 10-2021-0113289

(51) Int. Cl.
*G09G 3/20*   (2006.01)

(52) U.S. Cl.
CPC ....... *G09G 3/2092* (2013.01); *G09G 2330/04* (2013.01); *G09G 2330/06* (2013.01)

(58) Field of Classification Search
CPC ............. G09G 3/2092; G09G 2330/04; G09G 2330/06; H10K 59/82; H10K 59/131
See application file for complete search history.

(56) References Cited

U.S. PATENT DOCUMENTS

| | | | |
|---|---|---|---|
| 4,432,610 A * | 2/1984 | Kobayashi | ........ G02F 1/133553 349/114 |
| 10,310,341 B2 | 6/2019 | Choi et al. | |
| 10,593,899 B2 | 3/2020 | Jung | |
| 11,543,917 B2 * | 1/2023 | Kono | .................. G02F 1/133 |
| 11,710,813 B2 * | 7/2023 | Lee | .................. G02B 27/0006 257/79 |
| 2008/0024714 A1 * | 1/2008 | Park | .................. H01L 23/552 349/150 |

(Continued)

FOREIGN PATENT DOCUMENTS

| KR | 10-0576872 | 5/2006 |
|---|---|---|
| KR | 10-2017-0002283 A | 1/2017 |

(Continued)

OTHER PUBLICATIONS

Korean Office Action for KR Application No. 10-2021-0113289, dated Dec. 8, 2024, 7 pages.

*Primary Examiner* — Jose R Soto Lopez
(74) *Attorney, Agent, or Firm* — Womble Bond Dickinson (US) LLP

(57) ABSTRACT

The display device includes an array substrate including a display area in which pixels are located, a peripheral area adjacent to the display area, and a pad area adjacent to the peripheral area and in which pad electrodes are located, an electrified layer under the array substrate, a first driving member on the array substrate at the pad area, a flexible circuit film including connection lines respectively electrically connected to the pad electrodes, a conductive connecting part electrically connected to the electrified layer by passing through the array substrate at the pad area, and a covering member covering a portion of the flexible circuit film and the first driving member at the pad area, and electrically connected to the conductive connecting part.

18 Claims, 8 Drawing Sheets

(56) References Cited

U.S. PATENT DOCUMENTS

| | | | | |
|---|---|---|---|---|
| 2012/0098736 A1* | 4/2012 | Yee | G06F 1/169 |
| | | | 345/76 |
| 2013/0329171 A1* | 12/2013 | Xu | G09G 3/36 |
| | | | 438/30 |
| 2015/0301630 A1* | 10/2015 | Lee | G06F 3/0383 |
| | | | 345/163 |
| 2016/0079318 A1* | 3/2016 | Kim | H10K 59/00 |
| | | | 315/33 |
| 2016/0377905 A1* | 12/2016 | Choi | G02F 1/13452 |
| 2017/0064826 A1* | 3/2017 | Park | H05K 1/189 |
| 2017/0082888 A1* | 3/2017 | Park | G02F 1/1339 |
| 2018/0113333 A1* | 4/2018 | Zhu | G09G 3/3611 |
| 2019/0035352 A1* | 1/2019 | Bei | G09G 3/3688 |
| 2019/0096299 A1* | 3/2019 | Lin | H10D 86/40 |
| 2019/0107909 A1* | 4/2019 | Kim | G06F 3/0412 |
| 2019/0123125 A1* | 4/2019 | Seki | H10K 50/8426 |
| 2019/0164487 A1* | 5/2019 | Lee | H10K 50/844 |
| 2019/0229177 A1* | 7/2019 | Kim | H10D 86/60 |
| 2019/0251890 A1* | 8/2019 | Guo | G06F 3/0412 |
| 2019/0257875 A1* | 8/2019 | Hao | H01L 23/60 |
| 2019/0279575 A1* | 9/2019 | Kim | G09G 3/3225 |
| 2019/0305234 A1* | 10/2019 | Jung | H10K 59/87 |
| 2019/0324332 A1* | 10/2019 | Kang | H10D 86/60 |
| 2020/0029475 A1* | 1/2020 | Park | H05K 9/0079 |
| 2020/0177999 A1* | 6/2020 | Ahn | H04R 1/025 |
| 2020/0192433 A1* | 6/2020 | Shin | G09F 9/301 |
| 2020/0272267 A1* | 8/2020 | Xu | G09G 3/20 |
| 2020/0302841 A1* | 9/2020 | Jung | G09G 3/32 |
| 2020/0343326 A1* | 10/2020 | Park | H10D 89/931 |
| 2020/0381508 A1* | 12/2020 | Jeon | H10K 59/38 |
| 2021/0013270 A1* | 1/2021 | Yu | H10K 59/12 |
| 2021/0018802 A1* | 1/2021 | Du | H05F 3/04 |
| 2021/0181816 A1* | 6/2021 | Watanabe | G06F 1/1656 |
| 2021/0202676 A1* | 7/2021 | Jeong | H10K 59/10 |
| 2021/0216107 A1* | 7/2021 | Lee | H05K 1/0259 |
| 2021/0217353 A1* | 7/2021 | Zhao | G09G 3/32 |
| 2021/0231999 A1* | 7/2021 | Imazeki | G09F 9/00 |
| 2021/0288129 A1* | 9/2021 | Okabe | H10K 59/131 |
| 2022/0115417 A1* | 4/2022 | Tian | H10D 86/021 |
| 2022/0208801 A1* | 6/2022 | Itoh | G09G 3/3648 |
| 2022/0320078 A1* | 10/2022 | Wang | H10D 86/60 |
| 2023/0074967 A1* | 3/2023 | Lee | B32B 3/30 |
| 2023/0092438 A1* | 3/2023 | Park | G09G 3/006 |
| | | | 345/55 |

FOREIGN PATENT DOCUMENTS

| | | |
|---|---|---|
| KR | 10-2019-0115548 A | 10/2019 |
| KR | 10-2019-0121469 | 10/2019 |
| KR | 10-2020-0001654 | 1/2020 |
| KR | 10-2020-0047811 | 5/2020 |
| KR | 10-2021-0081953 A | 7/2021 |

* cited by examiner

FIG. 2
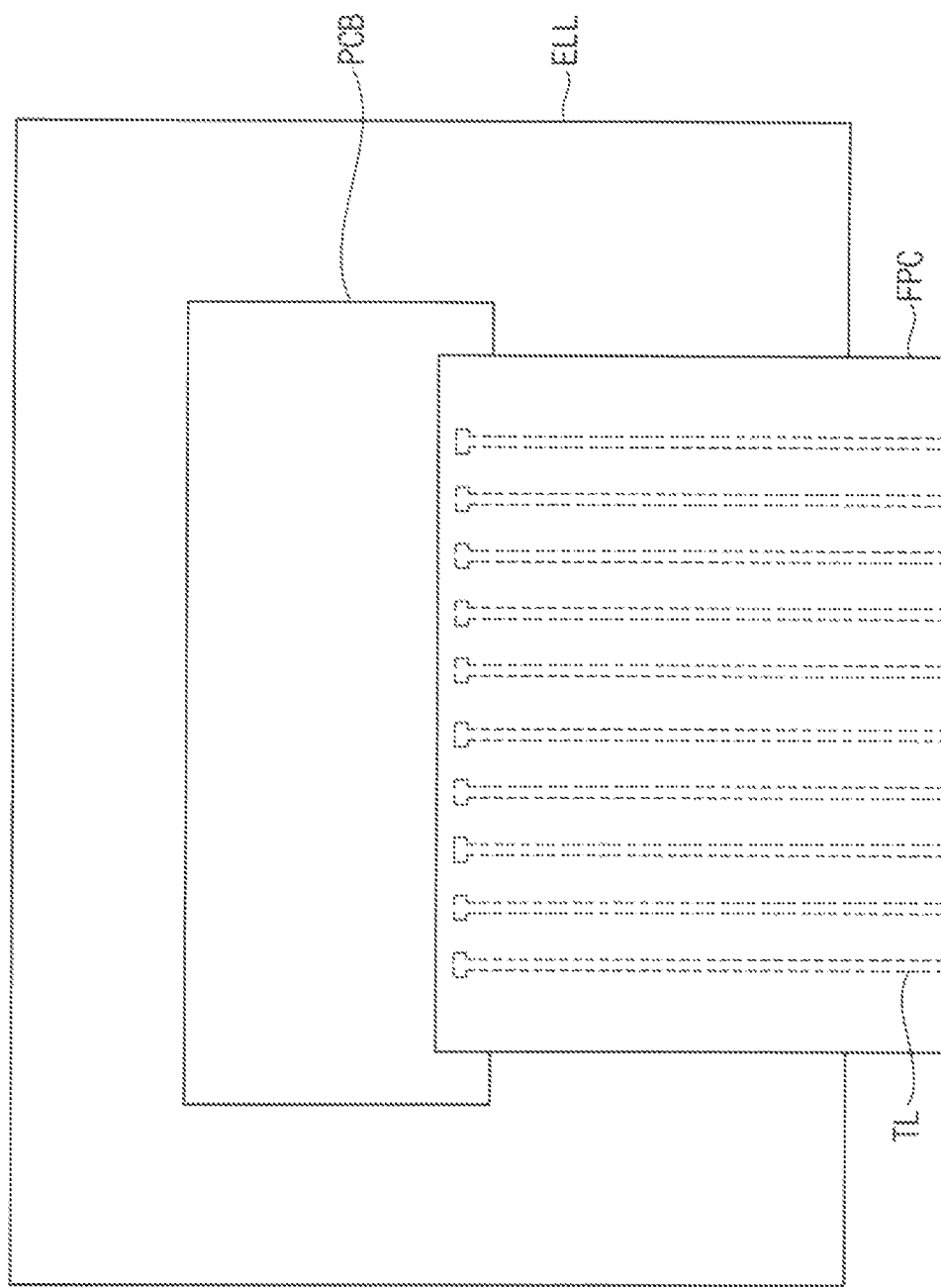
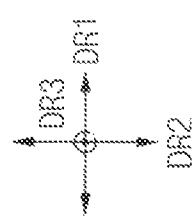

DISPLAY DEVICE AND MANUFACTURING METHOD OF THE SAME

CROSS-REFERENCE TO RELATED APPLICATION

This application claims priority to, and the benefit of, Korean Patent Application No. 10-2021-0113289, filed on Aug. 26, 2021, the content of which in its entirety is herein incorporated by reference.

BACKGROUND

1. Field

Implementations of the present disclosure relate generally to a display device.

2. Discussion of the Background

A display device may include a plurality of pixels and a driving member (e.g., a driving circuit). The driving member may provide a driving signal to the plurality of pixels, and accordingly, each of the plurality of pixels may emit light. The plurality of pixels and the driving member may be located in the display device.

The plurality of pixels and the driving member may be damaged by static electricity generated in the display device. Accordingly, display quality of the display device may be deteriorated.

SUMMARY

Embodiments provide a display device with improved display quality.

A display device according to some embodiments may include an array substrate including a display area in which pixels are located, a peripheral area adjacent to the display area, and a pad area adjacent to the peripheral area and in which pad electrodes are located, an electrified layer under the array substrate, a first driving member on the array substrate at the pad area, a flexible circuit film including connection lines respectively electrically connected to the pad electrodes, a conductive connecting part electrically connected to the electrified layer by passing through the array substrate at the pad area, and a covering member covering a portion of the flexible circuit film and the first driving member at the pad area, and electrically connected to the conductive connecting part.

The conductive connecting part may be electrically insulated from each of the pixels, the pad electrodes, the first driving member, and the connection lines.

The covering member may include a first covering member including an insulating material, and covering the portion of the flexible circuit film and the first driving member, and a second covering member including a conductive material, and electrically connected to the conductive connecting part.

The second covering member may be electrically connected to the conductive connecting part by passing through the first covering member.

The display device may further include an encapsulation substrate on the array substrate, and covering the pixels, and a polarizing layer on the encapsulation substrate.

At least a portion of the covering member may electrically contact the encapsulation substrate.

The display device may further include an upper covering member on the polarizing layer.

The upper covering member may contact the polarizing layer.

The display device may further include a buffer layer between the electrified layer and the array substrate.

The display device may further include a second driving member under the electrified layer.

A display device according to some embodiments may include an array substrate including a display area in which pixels are located, a peripheral area adjacent to the display area, and a pad area adjacent to the peripheral area and in which pad electrodes are located, an electrified layer under the array substrate, a first driving member on the array substrate at the pad area, a flexible circuit film including connection lines respectively electrically connected to the pad electrodes, and a dummy connection line electrically insulated from the pad electrodes, and a covering member covering a portion of the flexible circuit film and the first driving member at the pad area, and electrically connected to the dummy connection line.

The dummy connection line may be electrically insulated from the pixels, the first driving member, and the connection lines.

The display device may further include a conductive connecting part electrically connected to the dummy connection line by passing through the flexible circuit film, and electrically connecting the covering member and the dummy connection line.

The covering member may include a first covering member including an insulating material, and covering the portion of the flexible circuit film and the first driving member, and a second covering member including a conductive material, and electrically connected to the conductive connecting part.

The second covering member may be electrically connected to the dummy connection line.

The display device may further include an encapsulation substrate on the array substrate and covering the pixels, and a polarizing layer on the encapsulation substrate.

At least a portion of the covering member may electrically contact the encapsulation substrate.

The display device may further include an upper covering member on the polarizing layer.

The upper covering member may contact the polarizing layer.

The display device may further include a second driving member under the electrified layer.

In the display device according to embodiments of the present disclosure, the covering member may be electrically connected to the electrified layer through a conductive connecting part. Accordingly, static electricity generated inside the display device may be induced to the electrified layer through the covering member.

In the display device according to embodiments of the present disclosure, the covering member may be electrically connected to the dummy connection line. Accordingly, static electricity generated inside the display device may be induced to the dummy connection line through the covering member.

In the manufacturing method according to embodiments of the present disclosure, because the pre-light blocking film layer is located under the mother substrate and then cut along the cutting line, a display device in which external light is effectively blocked may be provided.

It is to be understood that both the foregoing general description and the following detailed description are examples and are intended to provide further explanation of the present disclosure and aspects of the claims.

BRIEF DESCRIPTION OF THE DRAWINGS

The accompanying drawings, which are included to provide a further understanding of the present disclosure and are incorporated in and constitute a part of this specification, illustrate embodiments of the present disclosure together with the description.

FIG. 1 and FIG. 2 are plan views illustrating a display device according to some embodiments.

DETAILED DESCRIPTION

Figure 1:
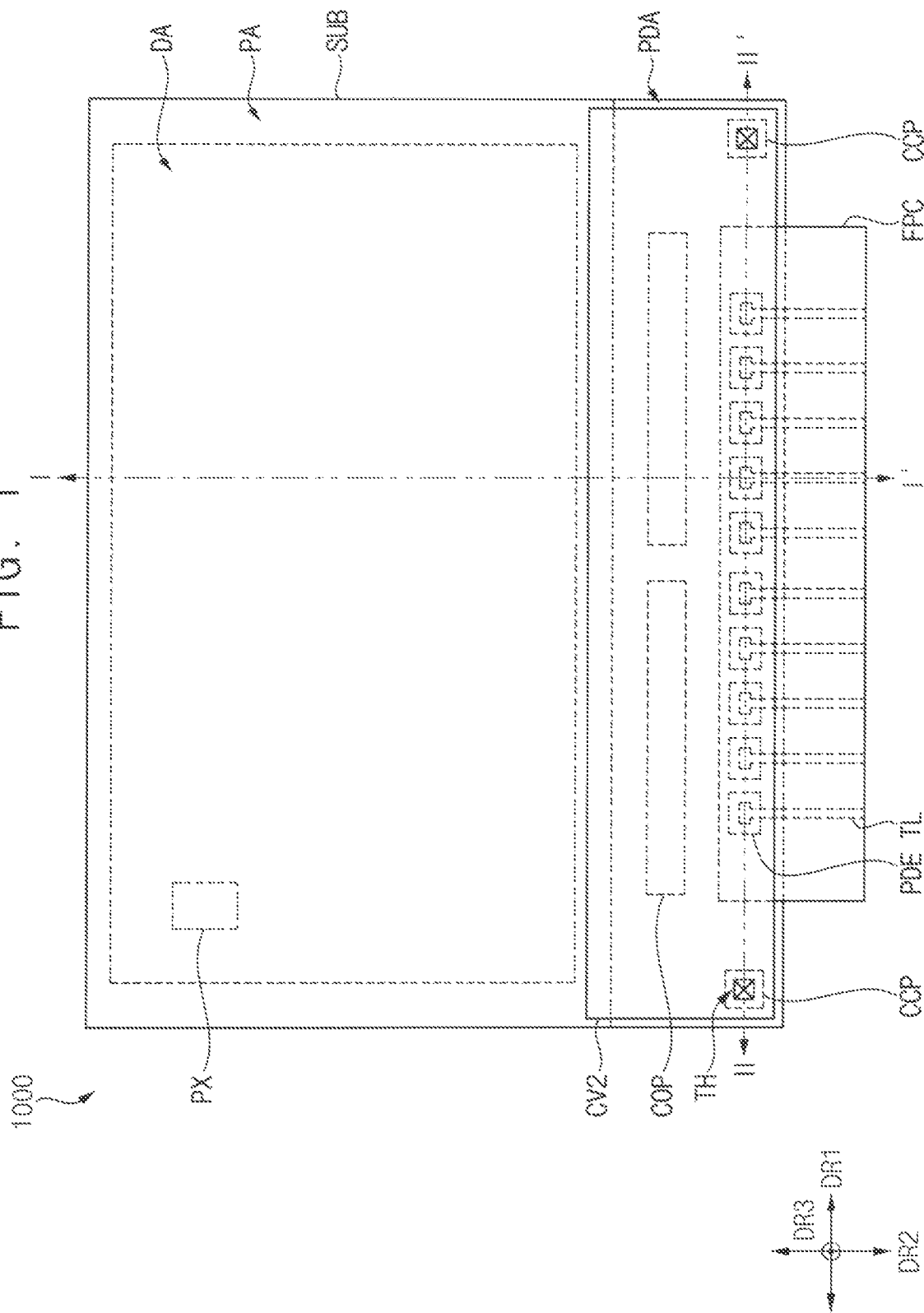

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 3:
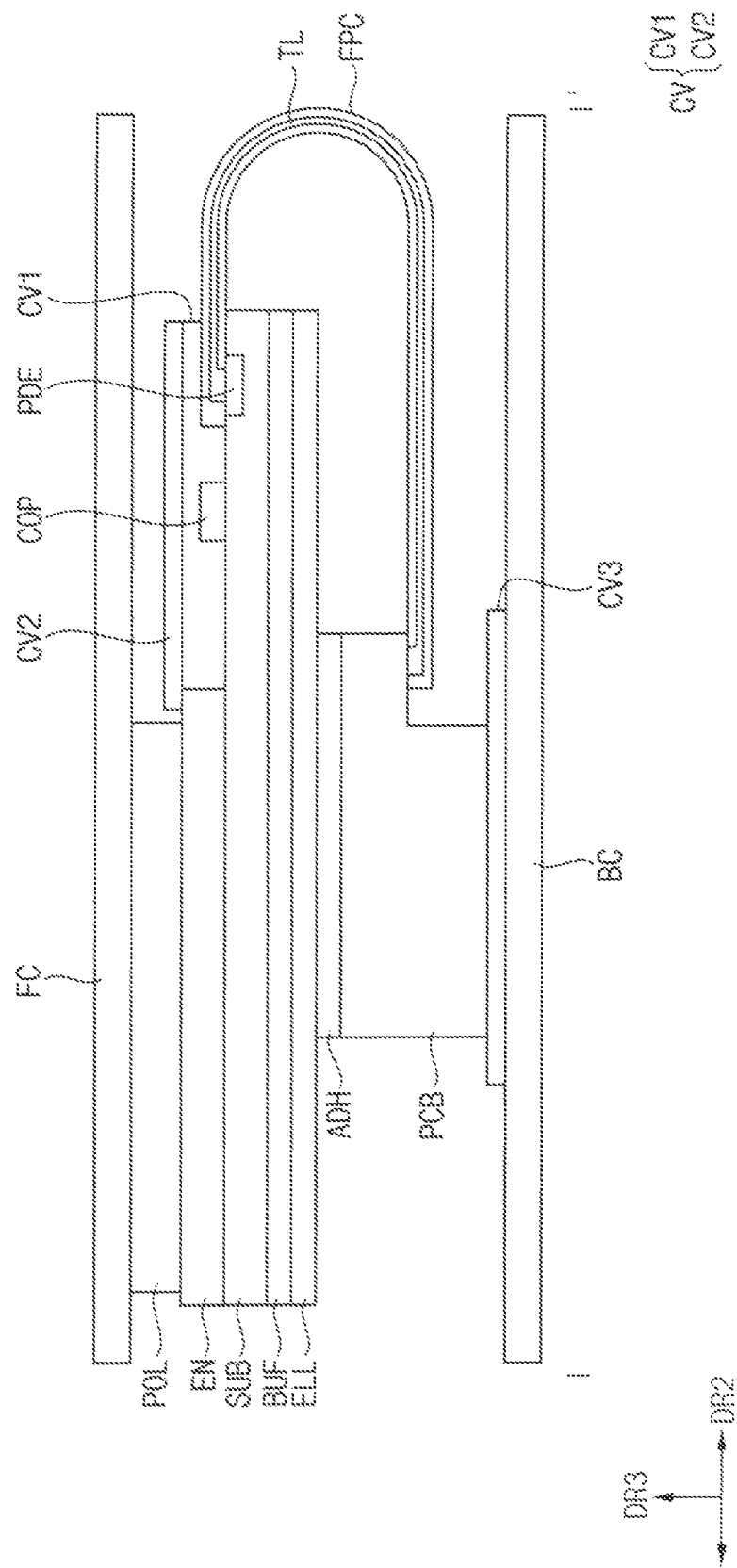
FIG. 3 is a cross-sectional view taken along the line of FIG. 1.
Figure 4:
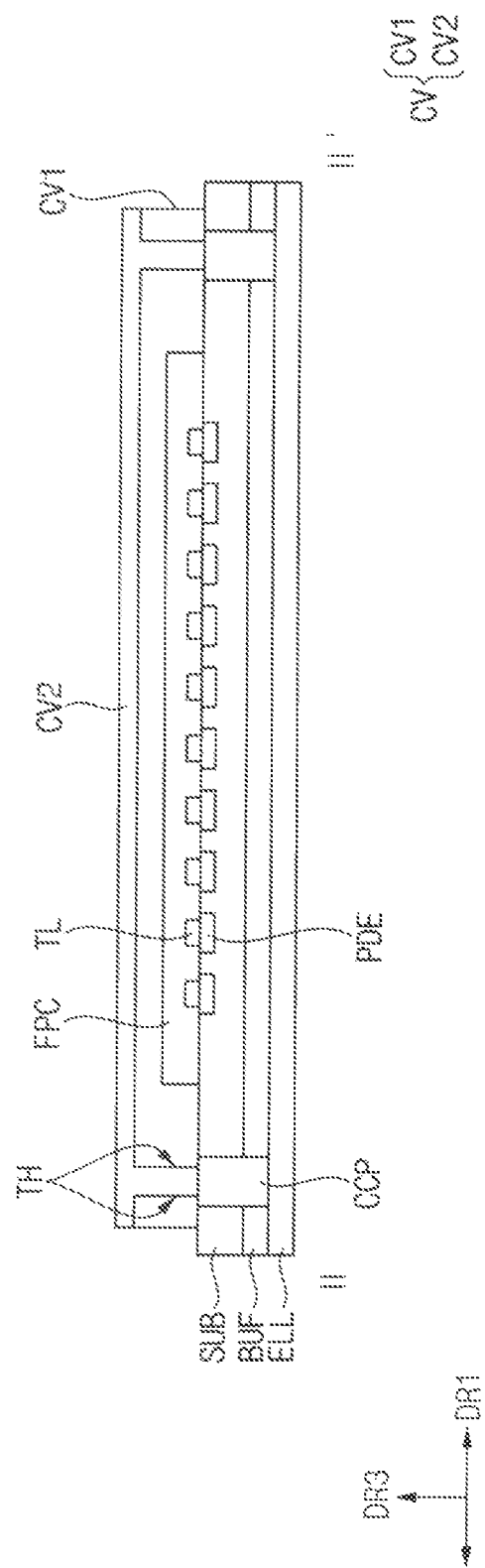
FIG. 4 is a cross-sectional view taken along the line of FIG. 1.

FIG. 1 and FIG. 2 are plan views illustrating a display device according to some embodiments. FIG. 3 is a cross-sectional view taken along the line of FIG. 1. FIG. 4 is a cross-sectional view taken along the line of FIG. 1.

Referring to FIG. 1, FIG. 2, FIG. 3, and FIG. 4, a display device 1000 according to some embodiments may include an array substrate SUB, an encapsulation substrate EN, a polarizing layer POL, a buffer layer BUF, an electrified layer ELL, a first driving member (e.g., driving circuit) COP, a second driving member PCB, a flexible circuit film FPC, a conductive connecting part CCP, a first covering member CV1, a second covering member CV2, and a third covering member CV3.

The array substrate SUB may include a display area DA, a peripheral area PA, and a pad area PDA.

A plurality of pixels PX may be located in the display area DA. Each of the plurality of pixels PX may emit light. The plurality of pixels PX may be arranged in a matrix form. For example, the plurality of pixels PX may be arranged in a first direction DR1, and may be arranged in a second direction DR2 that is substantially perpendicular to the first direction DR1.

The peripheral area PA may be adjacent to at least one side of the display area DA. A driving member (e.g., a driving circuit) may be located in the peripheral area PA. The driving member may be electrically connected to the plurality of pixels PX to provide a driving signal to the plurality of pixels PX. The plurality of pixels PX may emit light having a luminance corresponding to an intensity of the driving signal. In some embodiments, the driving member may include a gate driver. In other embodiments, the driving member may include a light emitting control driver.

The pad area PDA may be adjacent to at least one side of the peripheral area PA. A plurality of pad electrodes PDE may be located in the pad area PDA. The plurality of pad electrodes PDE may be electrically connected to the plurality of pixels PX.

The encapsulation substrate EN may be located on the array substrate. In some embodiments, the encapsulation substrate EN may overlap the display area DA, and a portion of the peripheral area PA adjacent to the display area DA. The encapsulation substrate EN may cover the plurality of pixels PX. The encapsulation substrate EN may protect the plurality of pixels from moisture and impurities.

The polarizing layer POL may be located on the encapsulation substrate EN. The polarizing layer POL may reduce or prevent external light incident from outside of the display device 1000 from being reflected inside the display device 1000 and being recognized by a user.

The buffer layer BUF may be located under the array substrate SUB. The buffer layer BUF may include an insulating material. The buffer layer BUF may protect the array substrate SUB from external impact. In addition, the buffer layer BUF may protect the array substrate SUB from moisture and impurities.

The electrified layer ELL may be located under the buffer layer BUF. The electrified layer ELL may include a conductive material. For example, the electrified layer ELL may include aluminum or copper. Each of the array substrate SUB, the encapsulation substrate EN, and the polarizing layer POL located on the electrified layer ELL may be flexible. The electrified layer ELL may have relatively high rigidity when compared to each of the array substrate SUB, the encapsulation substrate EN, and the polarizing layer POL, and accordingly, the electrified layer ELL may support the array substrate SUB, the encapsulation substrate EN, and the polarizing layer POL.

The first driving member COP may be located on the array substrate SUB. The first driving member COP may be located in the pad area PDA. The first driving member COP may be electrically connected to the plurality of pixels PX and the plurality of pad electrodes PDE. The first driving member COP may generate the driving signal for driving the plurality of pixels PX.

The second driving member PCB may be located under the electrified layer ELL. In some embodiments, an adhesive layer ADH may be located between the second driving member PCB and the electrified layer ELL. The second driving member PCB may be fixed (e.g., secured) under the electrified layer ELL by the adhesive layer ADH. The second driving member PCB may generate the driving signal for driving the plurality of pixels PX.

The flexible circuit film FPC may include a plurality of connection lines TL. The flexible circuit film FPC and the plurality of connection lines TL may be flexible. At least a portion of the plurality of connection lines TL may be electrically connected to the plurality of pad electrodes PDE, and at least another portion of the plurality of connection lines TL may be electrically connected to the second driving member PCB. Accordingly, the plurality of connection lines TL may electrically connect the plurality of pad electrodes PDE and the second driving member PCB.

The conductive connecting part CCP may be electrically connected to the electrified layer ELL. In some embodiments, the electrified layer ELL may pass through the array substrate SUB and the buffer layer BUF to electrically contact the electrified layer ELL. The conductive connecting part CCP may include a metal. For example, the conductive connecting part CCP may include aluminum or copper.

The conductive connecting part CCP may be electrically insulated from each of the plurality of pixels PX, the plurality of pad electrodes PDE, the first driving member COP, and the plurality of connection lines TL. In some embodiments, as shown in FIG. 1 and FIG. 4, two conductive connecting parts CCP may be located at respective corners of the pad area PDA. The corners of the pad area PDA may be an area in which the plurality of pixels PX, the plurality of pad electrodes PDE, the first driving member COP, and the plurality of connection lines TL are not located. However, location and number of the conductive connecting part CCP is not limited thereto. For example, three or more conductive connecting parts CCP may be located in the pad area PDA to be insulated from each of the plurality of pixels PX, the plurality of pad electrodes PDE, the first driving member COP, and the plurality of connection lines TL.

A covering member CV may cover the first driving member COP and the flexible circuit film FPC in the pad area PDA. Accordingly, the covering member CV may protect the first driving member COP and the flexible circuit film FPC in the pad area PDA from external impact.

The covering member CV may be electrically connected to the conductive connecting part CCP. In this case, the covering member CV may be electrically insulated from each of the plurality of pixels PX, the plurality of pad electrodes PDE, the first driving member COP, and the plurality of connection lines TL.

In some embodiments, the covering member CV may include the first covering member CV1 and the second covering member CV2. The first covering member CV1 may include an insulating material. The first covering member CV1 may cover the flexible circuit film FPC (e.g., a portion thereof) and the first driving member COP. The second covering member CV2 may include a conductive material. For example, the second covering member CV2 may include a metal. The second covering member CV2 may be electrically connected to the conductive connecting part CCP. In this case, the second covering member CV2 may be electrically insulated from each of the plurality of pixels PX, the plurality of pad electrodes PDE, the first driving member COP, and the plurality of connection lines TL.

In some embodiments, the second covering member CV2 may be electrically connected to the conductive connecting part CCP by passing through the first covering member CV1. In other words, the second covering member CV2 may penetrate the first covering member CV1, and may extend into a through hole TH exposing an upper surface of the conductive connecting part CCP, and thus, the second covering member CV2 may be electrically connected to the conductive connecting part CCP. In other embodiments, the second covering member CV2 may be electrically connected to the conductive connecting part CCP without passing through the first covering member CV1. For example, the second covering member CV2 may extend toward the conductive connecting part CCP along a side surface and/or a lower surface of the first covering member CV1 to be electrically connected to the conductive connecting part CCP.

In some embodiments, at least a portion of the covering member CV may be electrically connected to the encapsulation substrate EN. For example, at least a portion of the second covering member CV2 may electrically contact the encapsulation substrate EN in the peripheral area PA. Accordingly, static electricity generated in the encapsulation substrate EN may be induced to the electrified layer ELL through the covering member CV and the conductive connecting part CCP.

An upper covering member FC and the lower covering member BC may cover an upper surface and a lower surface of the display device 1000. The upper covering member FC and the lower covering member BC may be directly recognized by the user. The upper covering member FC may contact the polarizing layer POL. A third covering member CV3 covering (e.g., contacting) the second driving member PCB may be located between the lower covering member BC and the second driving member PCB. The lower covering member BC may contact the third covering member CV3.

Figure 5:
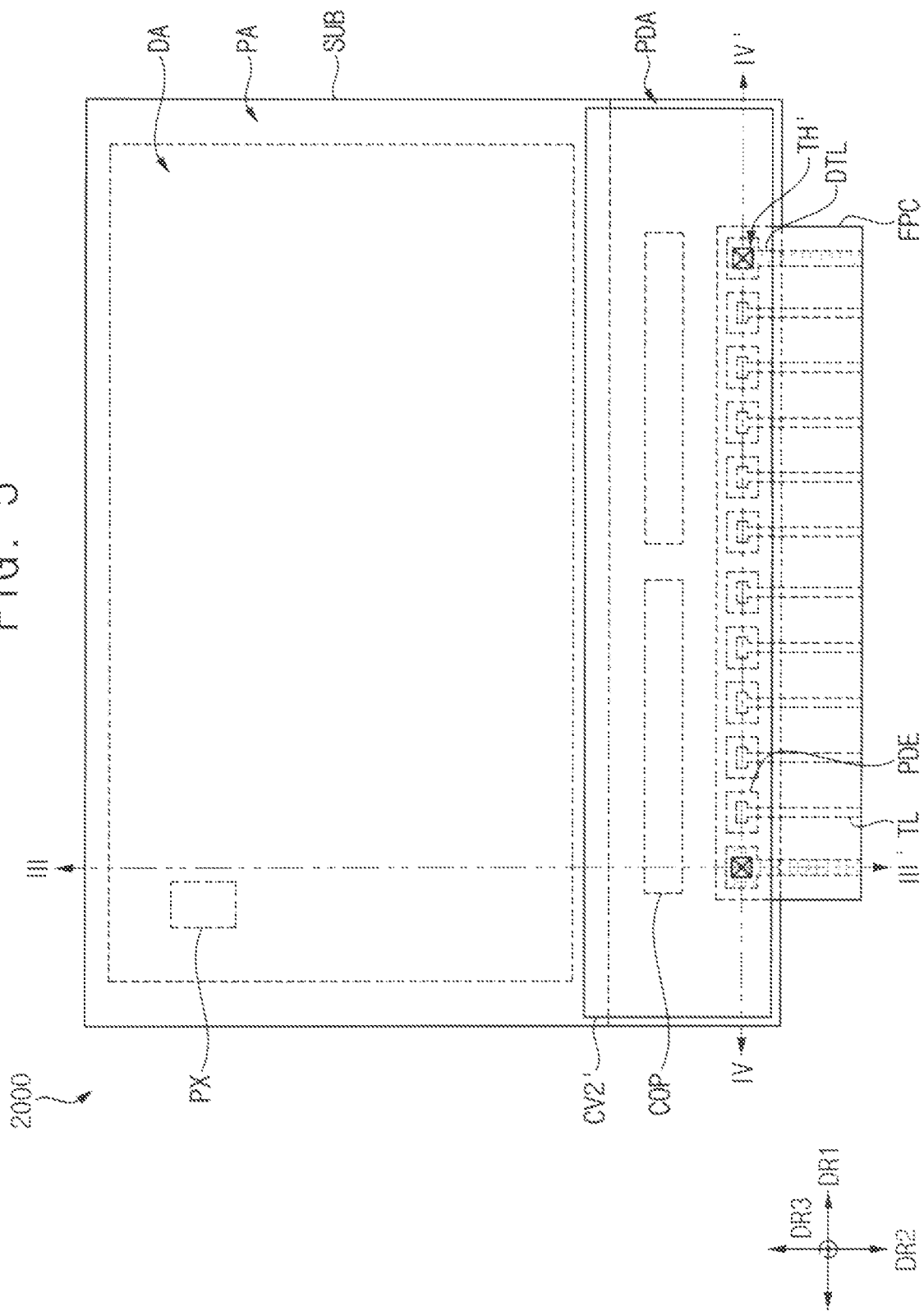
FIG. 5 and FIG. 6 are plan views illustrating a display device according to other embodiments.
Figure 6:
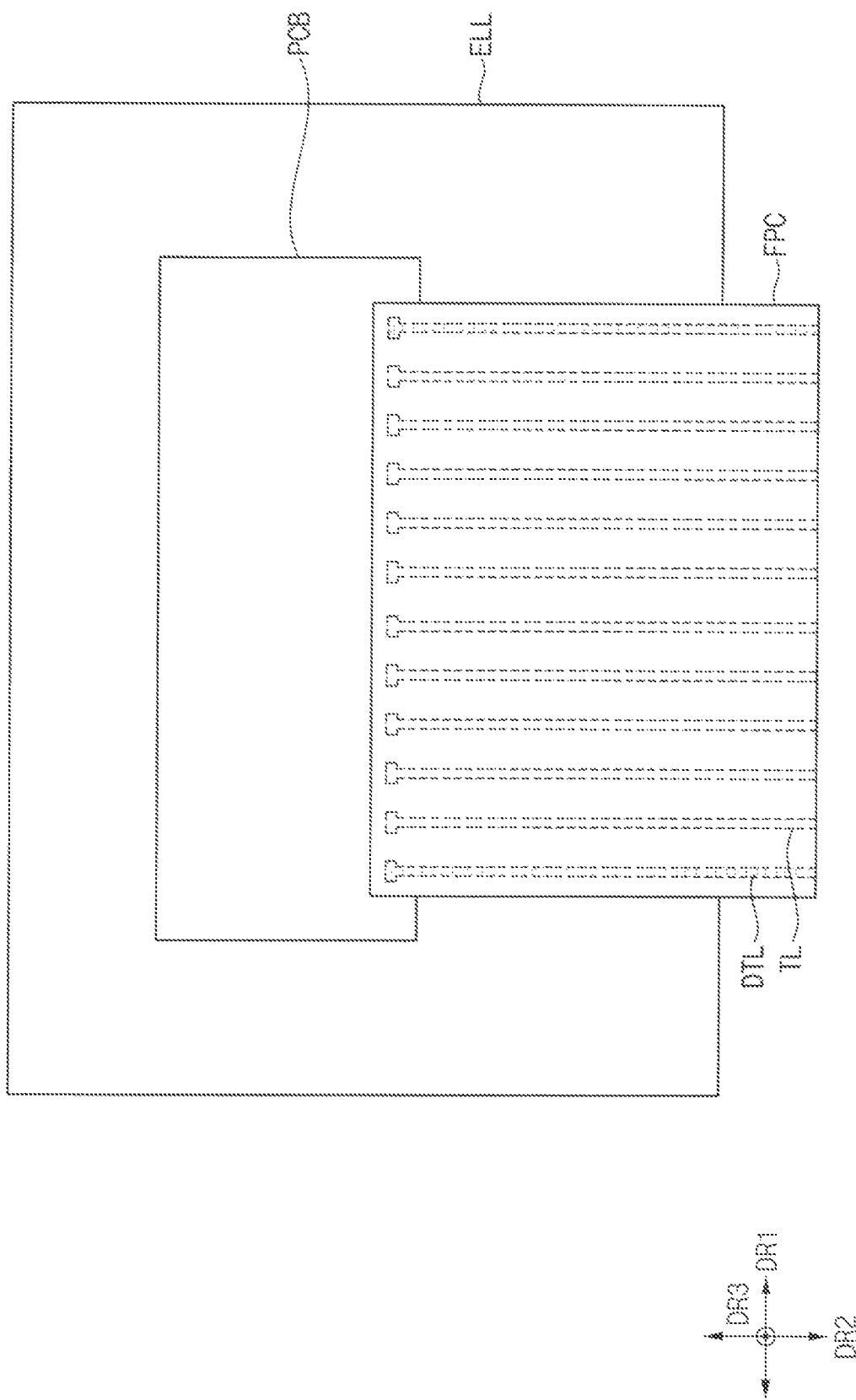
Figure 7:
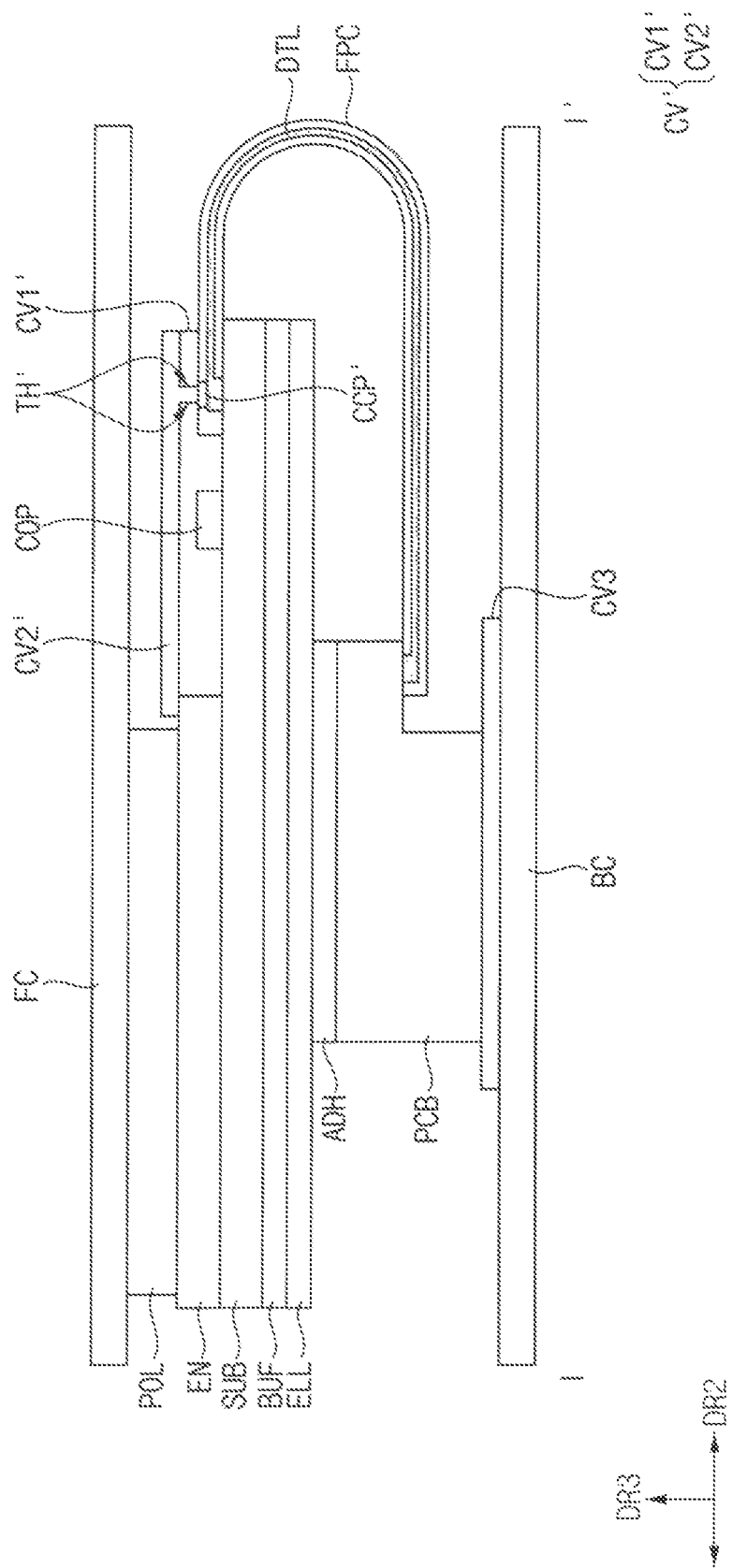
FIG. 7 is a cross-sectional view taken along the line of FIG. 5.
Figure 8:
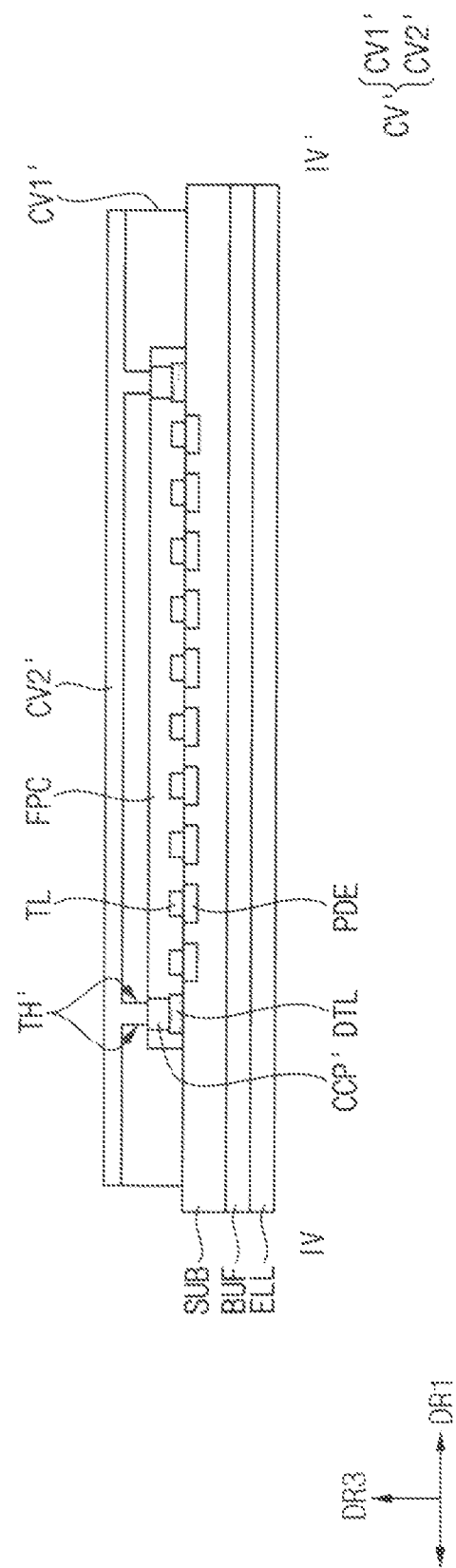
FIG. 8 is a cross-sectional view taken along the line IV-IV' of FIG. 5.

FIG. 5 and FIG. 6 are plan views illustrating a display device according to other embodiments. FIG. 7 is a cross-sectional view taken along the line of FIG. 5. FIG. 8 is a cross-sectional view taken along the line IV-IV' of FIG. 5.

Referring to FIG. 5, FIG. 6, FIG. 7, and FIG. 8, a display device 2000 according to other embodiments may include an array substrate SUB, an encapsulation substrate EN, a polarizing layer POL, a buffer layer BUF, an electrified layer ELL, a first driving member COP, a second driving member PCB, a flexible circuit film FPC, a conductive connecting part CCP', a first covering member CV1', a second covering member CV2', and a third covering member CV3.

The array substrate SUB may be substantially same as the array substrate SUB described with reference to FIG. 1 to FIG. 4. For example, the array substrate SUB may include a display area DA, a peripheral area PA, and a pad area PDA, a plurality of pixels PX may be located in the display area DA, a driving member (e.g., a driving circuit) for driving the plurality of pixels PX may be located in the peripheral area, and a plurality of pad electrodes PDE may be located in the pad area PDA.

The encapsulation substrate EN may be located on the array substrate SUB, the polarizing layer POL may be located on the encapsulation substrate EN, the buffer layer BUF may be located under the array substrate SUB, the electrified layer ELL may be located under the buffer layer BUF, the first driving member COP may be located on the array substrate SUB, and the second driving member PCB may be located under the electrified layer ELL. The encapsulation substrate EN, the polarizing layer POL, the buffer layer BUF, the electrified layer ELL, the first driving member COP, and the second driving member PCB may be, respectively, substantially the same as the encapsulation substrate EN, the polarizing layer POL, the buffer layer BUF, the electrified layer ELL, the first driving member COP, and the second driving member PCB.

The flexible circuit film FPC may include a plurality of connection lines TL and a dummy connection line DTL. The flexible circuit film FPC, the plurality of connection lines TL, and the dummy connection line DTL may be flexible.

At least a portion of the plurality of connection lines TL may be electrically connected to the plurality of pad electrodes PDE, and at least another portion of the plurality of connection lines TL may be electrically connected to the second driving member PCB. Accordingly, the plurality of connection lines TL may electrically connect the plurality of pad electrodes PDE and the second driving member PCB.

The dummy connection line DTL may not be electrically connected to the plurality of pad electrodes PDE. In some embodiments, the dummy connection line DTL may be electrically insulated from each of the plurality of pixels PX, the plurality of pad electrodes PDE, the first driving member COP, and the plurality of connection lines TL. The dummy connection line DTL may be connected to the grounding element included in the second driving member PCB.

In some embodiments, the display device 2000 may include a conductive connecting part CCP'. The conductive connecting part CCP' may be electrically connected to the dummy connection line DTL by penetrating the flexible circuit film FPC.

A covering member CV' may be electrically connected to the dummy connection line DTL. In some embodiments, the covering member CV' may be electrically connected to the dummy connection line DTL through the conductive connecting part CCP'. In this case, the covering member CV' may be electrically insulated from each of the plurality of pixels PX, the plurality of pad electrodes PDE, the first driving member COP, and the plurality of connection lines TL.

In some embodiments, the covering member CV' may include a first covering member CV1' and a second covering member CV2'. The first covering member CV1' may include an insulating material. The first covering member CV1' may cover the flexible circuit film FPC and the first driving member COP. The second covering member CV2' may include a conductive material. For example, the second covering member CV2' may include a metal. The second covering member CV2' may be electrically connected to the dummy connection line DTL. In this case, the second covering member CV2' may be electrically insulated from each of the plurality of pixels PX, the plurality of pad electrodes PDE, the first driving member COP, and the plurality of connection lines TL.

The second covering member CV2' may be electrically connected to the dummy connection line DTL by passing through the first covering member CV1'. In some embodiments, the first covering member CV1' may extend into a through hole TH' penetrating the second covering member CV2', and accordingly, the first covering member CV1' may be electrically connected to the dummy connection line DTL through the conductive connecting part CCP'.

In some embodiments, at least a portion of the covering member CV' may electrically contact the encapsulation substrate EN. For example, at least a portion of the covering member CV' may electrically contact the encapsulation substrate EN in the peripheral area PA. Accordingly, static electricity generated in the encapsulation substrate EN may be induced to the dummy connection line DTL through the covering member CV'.

An upper covering member FC and the lower covering member BC may cover an upper surface and a lower surface of the display device 2000. The upper covering member FC and the lower covering member BC may be directly recognized by the user. The upper covering member FC may contact the polarizing layer POL. A third covering member CV3 covering (e.g., contacting) the second driving member PCB may be located between the lower covering member BC and the second driving member PCB. The lower covering member BC may contact the third covering member CV3.

Although certain embodiments and implementations have been described herein, other embodiments and modifications will be apparent from this description. Accordingly, the present disclosure is not limited to such embodiments, but rather to the broader scope of the appended claims and various obvious modifications and functionally equivalent arrangements as would be apparent to a person of ordinary skill in the art.

What is claimed is:
1. A display device comprising:
    an array substrate comprising a display area in which pixels are located, a peripheral area adjacent to the display area, and a pad area adjacent to the peripheral area and in which pad electrodes are located;
    an electrified layer under the array substrate;
    a first driving member on the array substrate at the pad area;
    a flexible circuit film comprising connection lines respectively electrically connected to the pad electrodes;
    a conductive connecting part electrically connected to the electrified layer by passing through the array substrate at the pad area;
    a covering member comprising:
        an insulating first covering member above the array substrate, contacting a portion of the flexible circuit film and the first driving member, and surrounding the first driving member in plan view at the pad area; and a conductive second covering member above the first covering member, contacting a top surface of an encapsulation substrate, and electrically connected to the conductive connecting part, the encapsulation substrate on the array substrate, covering the pixels, and electrically contacting the second covering member, wherein static electricity generated in the encapsulation substrate is configured to be induced to the electrified layer through the covering member and the conductive connecting part.

2. The display device of claim 1, wherein the conductive connecting part is electrically insulated from each of the pixels, the pad electrodes, the first driving member, and the connection lines.

3. The display device of claim 1, wherein the second covering member is electrically connected to the conductive connecting part by passing through the first covering member.

4. The display device of claim 1, further comprising a polarizing layer on the encapsulation substrate.

5. The display device of claim 1, wherein static electricity generated in the encapsulation substrate is configured to be induced to the electrified layer through the second covering member and the conductive connecting part.

6. The display device of claim 4, further comprising an upper covering member on the polarizing layer.

7. The display device of claim 6, wherein the upper covering member contacts the polarizing layer.

8. The display device of claim 6, further comprising a buffer layer between the electrified layer and the array substrate.

9. The display device of claim 1, further comprising a second driving member under the electrified layer.

10. A display device comprising:
an array substrate comprising a display area in which pixels are located, a peripheral area adjacent to the display area, and a pad area adjacent to the peripheral area and in which pad electrodes are located;
an electrified layer under the array substrate;
a first driving member on the array substrate at the pad area;
a flexible circuit film comprising connection lines respectively electrically connected to the pad electrodes, and a dummy connection line electrically insulated from the pad electrodes;
a covering member comprising:
an insulative first covering member above the array substrate, contacting a portion of the flexible circuit film and the first driving member, and surrounding the first driving member in plan view at the pad area; and
a conductive second covering member above the first covering member, contacting a top surface of an encapsulation substrate, and electrically connected to the dummy connection line, the encapsulation substrate being on the array substrate, covering the pixels, and electrically contacting the second covering member,
wherein static electricity generated in the encapsulation substrate is configured to be induced to the dummy connection line through the second covering member.

11. The display device of claim 10, wherein the dummy connection line is electrically insulated from the pixels, the first driving member, and the connection lines.

12. The display device of claim 10, further comprising a conductive connecting part electrically connected to the dummy connection line by passing through the flexible circuit film, and electrically connecting the second covering member and the dummy connection line.

13. The display device of claim 12, wherein the second covering member is electrically connected to the conductive connecting part.

14. The display device of claim 13, wherein the second covering member is electrically connected to the dummy connection line.

15. The display device of claim 10, further comprising a polarizing layer on the encapsulation substrate.

16. The display device of claim 15, further comprising an upper covering member on the polarizing layer.

17. The display device of claim 16, wherein the upper covering member contacts the polarizing layer.

18. The display device of claim 10, further comprising a second driving member under the electrified layer.

* * * * *